(12) United States Patent
Yang et al.

(10) Patent No.: US 7,256,081 B2
(45) Date of Patent: Aug. 14, 2007

(54) STRUCTURE AND METHOD TO INDUCE STRAIN IN A SEMICONDUCTOR DEVICE CHANNEL WITH STRESSED FILM UNDER THE GATE

(75) Inventors: Haining S. Yang, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 10/906,054

(22) Filed: Feb. 1, 2005

(65) Prior Publication Data
US 2006/0172500 A1 Aug. 3, 2006

(51) Int. Cl.
*H01L 21/338* (2006.01)
(52) U.S. Cl. ............... 438/184; 438/230; 257/69; 257/204; 257/900; 257/E29.26
(58) Field of Classification Search ........... 438/184, 438/230; 257/69, 204, 900, E29.26
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |

(Continued)

FOREIGN PATENT DOCUMENTS

JP 64-76755 3/1989

OTHER PUBLICATIONS

Kern Rim, et al., "Transconductance Enhancement in Deep Submicron Strained-Si *n*-MOSFETs", International Electron Devices Meeting, 26, 8, 1, IEEE, Sep. 1998.

(Continued)

*Primary Examiner*—Matthew Smith
*Assistant Examiner*—Thanh V. Pham
(74) *Attorney, Agent, or Firm*—Joseph P. Abate; Greenblum & Bernstein, P.L.C.

(57) ABSTRACT

A semiconductor device is provided with a stressed channel region, where the stresses film causing the stress in the stress channel region can extend partly or wholly under the gate structure of the semiconductor device. In some embodiments, a ring of stress film surround the channel region, and may apply stress from all sides of the channel. Consequently, the stress film better surrounds the channel region of the semiconductor device and can apply more stress in the channel region.

7 Claims, 7 Drawing Sheets

U.S. PATENT DOCUMENTS

| | | |
|---|---|---|
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,908,313 A * | 6/1999 | Chau et al. .......... 438/299 |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,717,216 B1 | 4/2004 | Doris et al. |
| 6,825,529 B2 | 11/2004 | Chidambarrao et al. |
| 6,831,292 B2 | 12/2004 | Currie et al. |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2004/0217420 A1* | 11/2004 | Yeo et al. .......... 257/347 |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0057787 A1 | 3/2006 | Doris et al. |
| 2006/0060925 A1 | 3/2006 | Doris et al. |

OTHER PUBLICATIONS

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGE HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps". 2004 IEEE, 4 pages.

J.C. Bean, et al., "GEx SI 1−x/Si Strained-Layer Superlattice Grown by Molecular Beam Epitaxy", J. Vac. Sci. Technol. A 2(2), Apr. -Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojuction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1−x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGE pMOSFET with Enhanced Device Performance and Scalability". 2000, IEEE, pp. 151-154.

* cited by examiner

STRUCTURE AND METHOD TO INDUCE STRAIN IN A SEMICONDUCTOR DEVICE CHANNEL WITH STRESSED FILM UNDER THE GATE

BACKGROUND OF THE INVENTION

Field of the Invention

The invention relates to CMOS devices and method of manufacture and more particularly to CMOS devices with stressed channels and method of manufacture.

Metal-oxide semiconductor transistors generally include a substrate made of a semiconductor material, such as silicon. The transistors also typically include a source region, a channel region and a drain region within the substrate. The channel region is located between the source and the drain regions. A gate stack, which usually includes a conductive material gate or gate conductor on top of a gate oxide layer and sidewall spacers, is generally provided above the channel region. More particularly, the gate oxide layer is typically provided on the substrate over the channel region, while the gate conductor is provided above the gate oxide layer. The sidewall spacers help define locations of source and drain ion implantation and form self-aligned silicide.

It is known that the amount of current flowing through a channel of a semiconductor device which has a given electric field across it is proportional to the mobility of the carriers in the channel. Thus, by increasing the mobility of the carriers in the channel, the operation speed of the transistor can be increased.

It is further known that mechanical stresses within a semiconductor device substrate can modulate device performance by, for example, increasing the mobility of the carriers in the semiconductor device. The mechanical stress can be induced by STI, gate spacer, an etch stopping layer or by silicide. So, certain types of stresses within a semiconductor device are known to enhance semiconductor device characteristics. Thus, to improve the characteristics of a semiconductor device, tensile and/or compressive stresses may be created in the channel of the n-type devices (e.g., nFETs) and/or p-type devices (e.g., pFETs). It should be noted that the same stress component, for example tensile stress or compressive stress, improves the device characteristics of one type of device (i.e., n-type device or p-type device) while negatively affecting the characteristics of the other type device.

For example, tensile stress along the channel direction increases electron mobility in an nFET device while decreasing hole mobility in a pFET. On the other hand, tensile stress perpendicular to the gate oxide surface degrades nFET performance, but improves pFET performance.

One method of creating stress in the channel of a CMOS device includes forming a film of stressed material over the CMOS device. Thus, some of the stress in the stressed film is coupled to the substrate of the CMOS device thereby generating stress in the channel of the CMOS device. Because the enhanced carrier mobility due to mechanical stress is proportional to the amount of stress, it is desirable to create as much stress in the channel as possible. Additionally, stresses in the stressed film are generated due to appropriately adjusting characteristics in the stressed film deposition process, or introducing stress-producing dopants into the stressed film. It should be noted that such methods of producing a stressed film are limited to producing a stress film with an internal stress on the order of a couple of GigaPascal (GPa). Consequently, with the maximum stress of a stressed film being limited to a couple of GPa, it is desirable to develop improved methods and structures for coupling the stress in a stressed film into the channel region of a CMOS device to increase the amount of stress in the channel.

SUMMARY OF THE INVENTION

In first aspect of the invention, a method of making a CMOS device with a stressed channel includes forming a silicon island comprising a top surface and a sidewall, and arranging an oxide gate on the top surface and above a sidewall of the silicon island. The method also includes arranging a stress film below the gate oxide and adjacent a sidewall of the silicon island.

In another aspect of the invention, a method of making a CMOS device with a stressed channel includes forming a silicon island comprising a top surface and multiple sidewalls, and arranging a gate oxide and gate stack on the top surface and above a sidewall of the silicon island. The method also includes surrounding a portion of the silicon island around the multiple sidewalls with a stress film.

In another aspect of the invention, a CMOS device with a stressed channel includes a silicon island comprising a top surface and a sidewall, and a gate oxide and gate stack arranged on the top surface and above a sidewall of the silicon island. The CMOS device also includes a stress film arranged below the gate oxide and adjacent a sidewall of the silicon island.

DETAILED DESCRIPTION OF EMBODIMENTS OF THE INVENTION

The invention reduces the electrical resistance of a channel in a semiconductor device which causes an increase in device operation speed. The invention also enhances stress in a channel of a semiconductor device by applying stress to the channel. Consequently, the invention applies stress to a channel with a stress film deposited either partially or completely under the gate. Accordingly, some embodiments of the invention completely surround the semiconductor device channel continuously on all sides thereby enhancing the amount of stress applied to the channel. The invention additionally allows for reducing the resistance of a channel in a semiconductor device by increasing the mobility of carriers or holes. Accordingly, the invention allows for producing semiconductor channels having higher stress levels and a correspondingly higher frequency or current response.

In one embodiment, the invention creates a unique structure so that high stressed silicon nitride film is introduced to the bottom part of the gate in the STI oxide region. Oxide is recessed so that, for example, $Si_3N_4$, can be deposited partially or completely under the gate. Additionally, the invention can induce strain in the adjacent channel region, which is especially effective for narrow width transistors.

Figure 1:
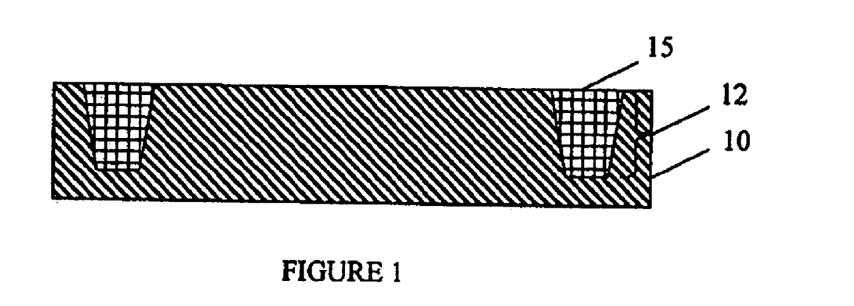
FIGS. 1-2 illustrate steps in fabricating a semiconductor device in accordance with the invention.

Referring to FIG. 1, a silicon substrate 10 has a trench 12 formed therein. The trench 12 may be formed by any of the processes well known in the art for forming a trench in a silicon substrate such as, for example, a dry etch process. After the trench 12 is formed, the trench is filled with a STI oxide 15 to form a shallow trench isolation structure or STI. Other dielectrics beside oxide may be used to fill the trench 12. The trench 12 may be filled with the STI oxide 15 by any of the processes well known in the art for depositing an oxide in a trench, such as, for example, HDP (high density plasma) oxide. After the trench 12 is filled with the STI oxide 15, the STI oxide 15 deposited on the surface of the silicon substrate 12 is removed and the surface is planarized so that the surface of the silicon substrate 12 and the surface of the STI oxide 15 in the trench 12 are co-planar.

Figure 2:
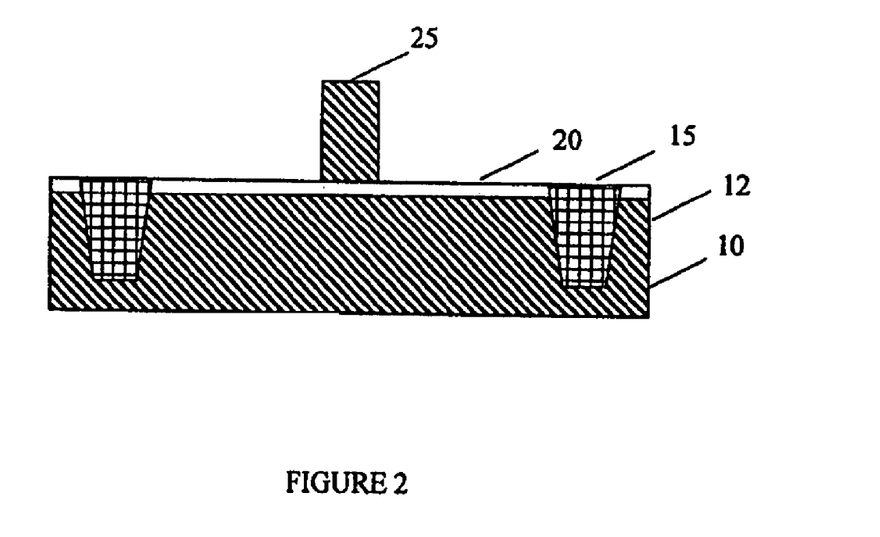

Referring to FIG. 2, a gate oxide 20 is formed on the surface of the silicon substrate 10. The gate oxide 20 can be formed by any of the methods well known in the art such as, for example, an oxidation followed with nitridation anneal. After the gate oxide 20 is formed, a layer of polysilicon is deposited. Once the polysilicon has been deposited on the gate oxide 20, the polysilicon is patterned and etched to form a polysilicon gate 25. The polysilicon can be deposited and etched by any of the methods well known in the art for polysilicon deposition and etching such as, for example, CVD polysilicon deposition with dry etch patterning.

Figure 3:
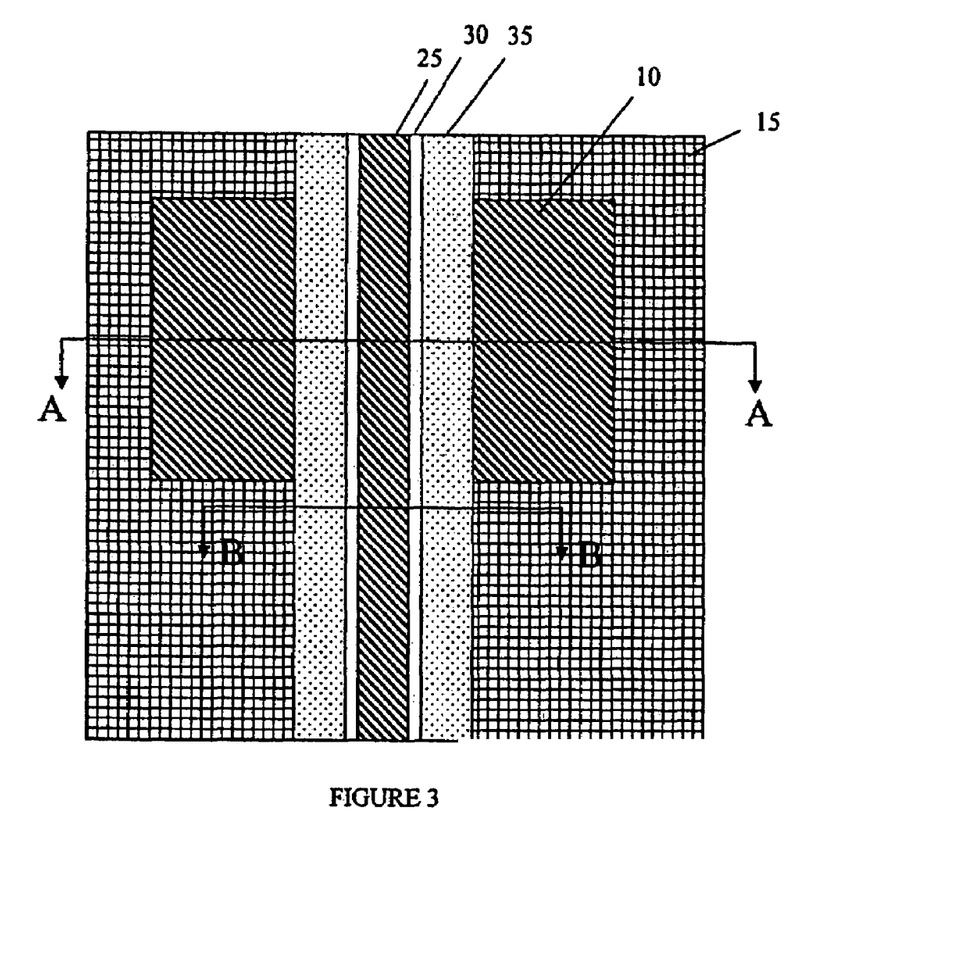
FIG. 3 illustrates a top view of a semiconductor device in accordance with the invention.

Optionally, as shown in FIG. 3, a layer of the oxide 30 may be conformably deposited on the silicon substrate 10, the STI oxide 15 and on the sides of the polysilicon gate 25. Dielectric sidewalls 35 are formed by depositing a dielectric over the thin oxide 30, and etching those portions of the dielectric to leave the sidewalls 35 in place polysilicon gate 25. The sidewall 35 may directly contact the side of the polysilicon gate 25, where the thin oxide 30 is not included.

Referring still to FIG. 3, a top down view of the resulting structure is shown where a silicon substrate 10 is surrounded by a STI oxide 15. On top of portions of the silicon substrate 10 and the STI oxide 15 is a polysilicon gate 25. On either side of the polysilicon gate 25 are thin oxides 30. Sidewall spacers 35 are adjacent to each thin oxide 30. Also shown are two lines A-A' and B-B' indicating cross-sections shown in subsequent figures. The cross-section indicated by A-A' is taken through a central region of the device and thus includes the channel region under the polysilicon gate 25. Cross-section B-B' is taken to one side of the semiconductor device through the STI oxide region 15 and thus is outside the channel region of the device.

Figure 4:
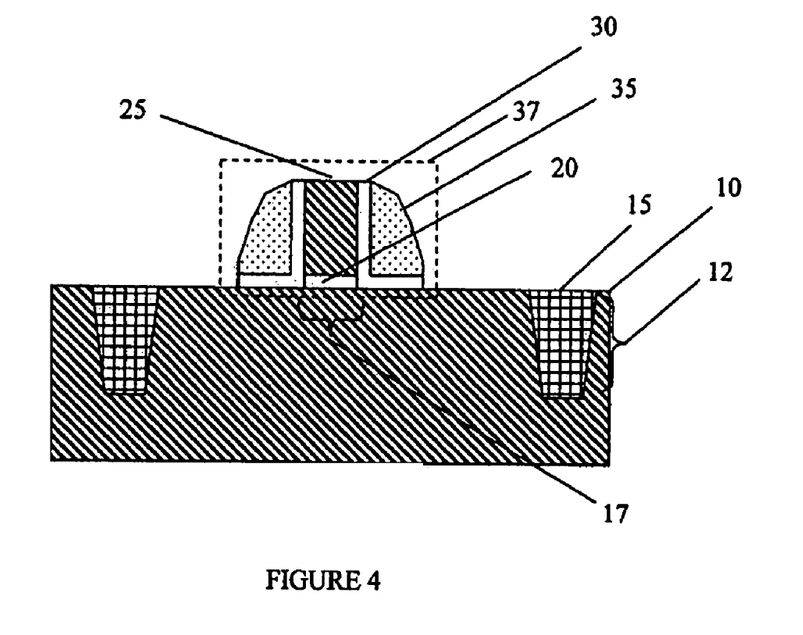
FIGS. 4-10 illustrate steps in fabricating a semiconductor device in accordance with the invention.
Figure 5:
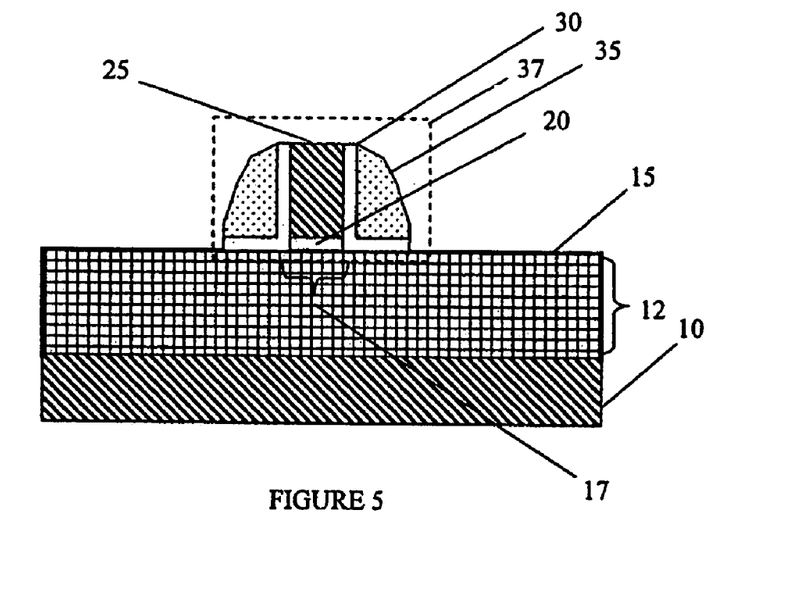
Figure 6:
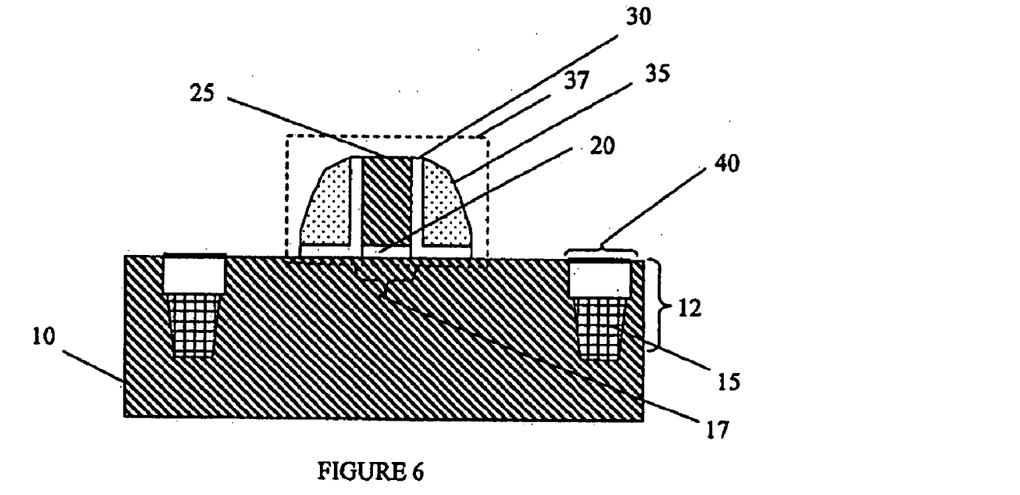
Figure 7:
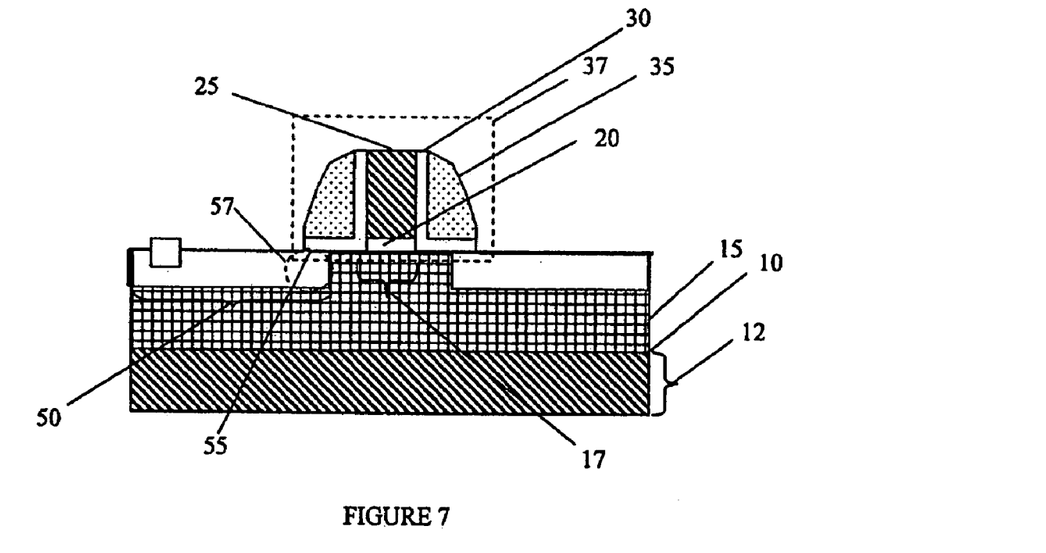
Figure 8:
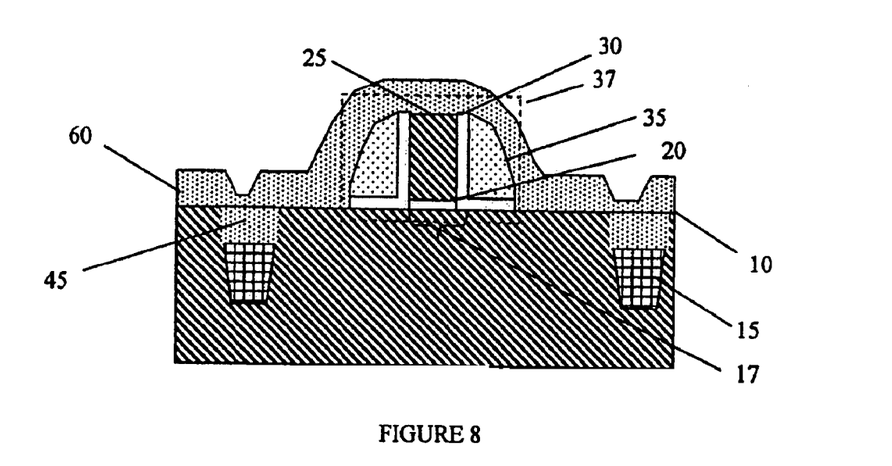
Figure 9:
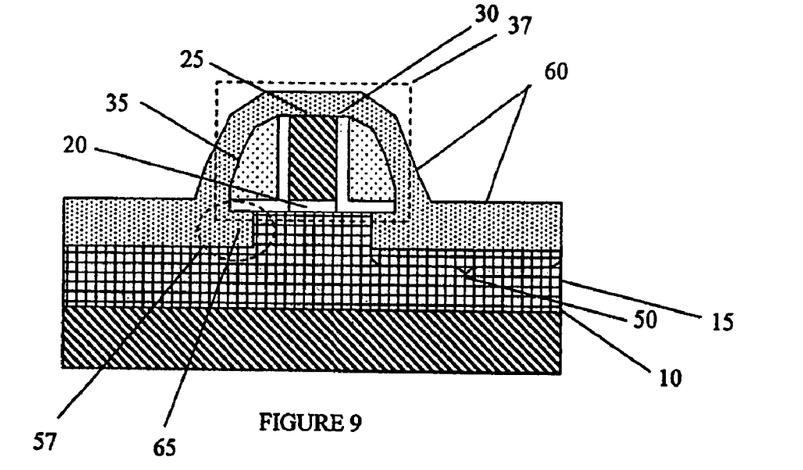

FIGS. 4, 6 and 8 show cross-sections taken along the line A-A' of FIG. 3 at various stages of fabrication of the first embodiment of the invention. FIGS. 5, 7 and 9 correspond to a cross-section taken along B-B' of FIG. 3 at various stages of fabrication of the first embodiment of the invention. Referring to FIG. 4, the A-A' horizontal cross-section shows a silicon substrate 10 having trenches 12 formed therein. The trenches 12 are filled with a STI oxide 15. The silicon substrate 10 has a channel region 17. Above the channel region 17 is a gate structure 37 which includes a gate oxide 20. Also included in the gate structure 37, on top of the gate oxide 20, is a polysilicon gate 25. On either side of the polysilicon gate 25 and on a portion of the top surface of the silicon substrate 10 next to the gate oxide 20 are thin oxide spacers 30. Formed against the sides and tops of thin oxide spacers 30 are a nitride sidewall 35.

Referring to FIG. 5, the B-B' cross-section shows a substrate 10 with a STI oxide 15 thereon. On top of the STI oxide 15 is the gate oxide 25 with a polysilicon gate 25 arranged thereupon. On either side of the polysilicon gate 25 and on top surfaces of the STI oxide 15 proximate the gate 25 is a thin oxide spacer 30. On the side and tops of the thin oxide spacer 30 are nitride sidewalls 35.

Accordingly, FIGS. 4 and 5 show, respectively, two cross-sections taken through the device shown in FIG. 3. FIG. 4 shows a cross-section through the device including the channel region 17, and FIG. 5 shows a cross-section through the device outside the channel region 17 which includes the STI oxide 15.

FIG. 6 shows cross-section along A-A' of FIG. 3 showing portions of the STI oxide 15 removed from the upper portions of the trenches 12 in the substrate 10. Removing a portion of the STI oxide 15 from the upper portion of the trench 12 forms a trough 40. The trough 40 of FIG. 6 corresponds substantially to the top portion of the trench 12.

Referring to FIG. 7, a cross-section along the line B-B' of FIG. 3 is shown for the same step in the fabrication process as FIG. 6. The etching process, which formed the trough 40 of FIG. 6, also formed a broad trench 50 in the STI oxide 15 running parallel to the gate structure 37. Additionally, the etching process etched a portion of the STI oxide 15 from underneath the sidewall 35 and a portion of the thin oxide spacer 30. Accordingly, an overhang 55 of the sidewall spacer 35 is formed. Additionally, a cavity or tunnel 57 is formed in the STI oxide 15 under a portion of the sidewall 35. It should be noted that in some embodiments, the tunnel 57 may extend partially under the polysilicon gate 35 or further to pass through the STI oxide 15 completely under the gate structure 37 to the other side of the gate structure 37 to meet a similar tunnel from the other side of the gate structure 37 thereby completely penetrating through a region under the gate structure 37. Because portions of the STI oxide 15 are etched away, the trough 40 and broad trench 50 may be formed without an additional masking step.

Referring to FIG. 8, the cross-section along A-A' shows a stressed nitride film 60 being formed over the gate structure 37, top surface of the silicon substrate 10 and filling the troughs 40 above the STI trenches 12. Accordingly, those regions of the STI trenches 12, which had the upper portions of the STI oxide 15 removed have now been filled with a stress film 45. Thus, the portions of the stress film 45 in the tops of the STI trenches 12 (i.e., the trough 40) run approximately parallel to the gate structure 37. Additionally, the portions of the stress film 45 in the tops of the STI trenches 12 are formed at about the same level in the silicon substrate 10 as the channel region 17 of the device.

Referring to FIG. 9, the cross-section along B-B' shows the stressed film 60 covering the gate structure 37. The stressed nitride film 60 is deposited into the broad trenches 50 and additionally is deposited into the tunnel region 65 underneath the overhang 55 of the sidewall. Accordingly, a portion of the stress film 60 is deposited under a portion of the gate structure 37, and may be referred to as a sub-gate stress film 65. The sub-gate stress film 65, in the tunnel 57, is deposited at a level similar to the channel region 17 of the semiconductor device.

As can be seen in FIGS. 8 and 9, a channel region 17 of the semiconductor device is surrounded on substantially all sides by a stress film 60. The stress film 60 lies at a level in the silicon substrate 10 approximately level to the channel region 17 and extends along the silicon substrate approximately parallel to the gate structure 37. Additionally, a portion of the stress film 60 extends under the gate structure 37 in tunnel regions 57 to form the sub-gate stress film 65. Thus, the stress film 60 lies at a region approximately level to the stress channel 17, extending under the gate structure 37. Due to being almost completely surrounded by stress film, the channel region 17 is subjected to higher levels of stress caused by the stress film 60.

Figure 10:
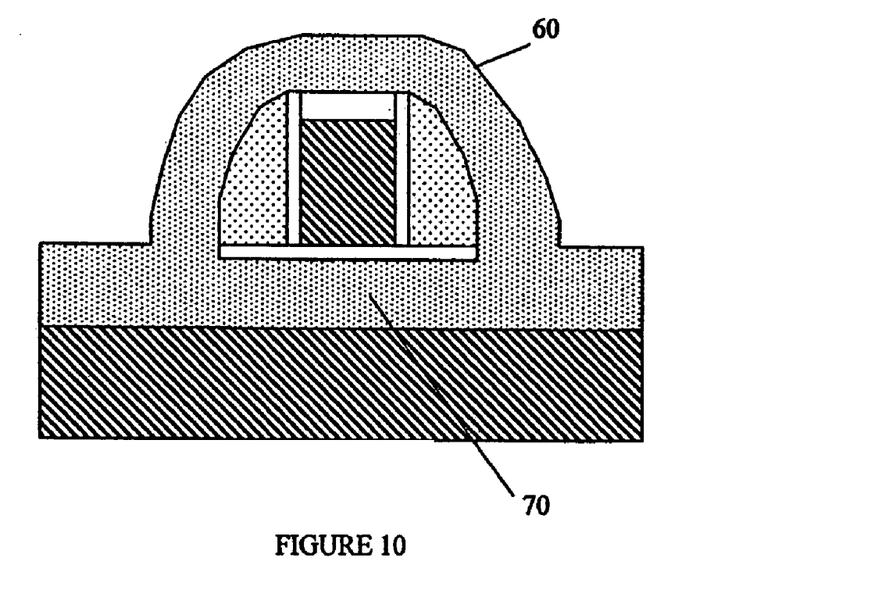

Referring to FIG. 10, in some embodiments, the stress film 60 extends completely under the gate structure 37 to form a sub-gate stress film 70. Such a structure is formed by etching a tunnel under the gate structure 37 and depositing the stress film therein. In this embodiment, the channel region 17 of the semiconductor device is entirely surrounded by the stress film 60 approximately level to the channel region 17.

Accordingly, the stress film is able to apply stress all around the channel region 17 and squeeze the channel region 17 in a compressive manner. It should be noted that in embodiments of the invention, the stress film 60 is configured so that the stress is applied in a direction that is perpendicular to a surface of the substrate, also referred to as the "Z-direction." It should also be noted that as the size of semiconductors are reduced, such a technique allows for ever increasing stresses to be applied to the channel region of the semiconductor device. Additionally, the orientation of stress in a stress film 60 can be adjusted by adjusting the chemistry and deposition parameters of the stress film 60 during deposition of the stress film 60 and thus, alter the magnitude and direction of stress caused in the channel region 17 of the semiconductor device.

Figure 11:
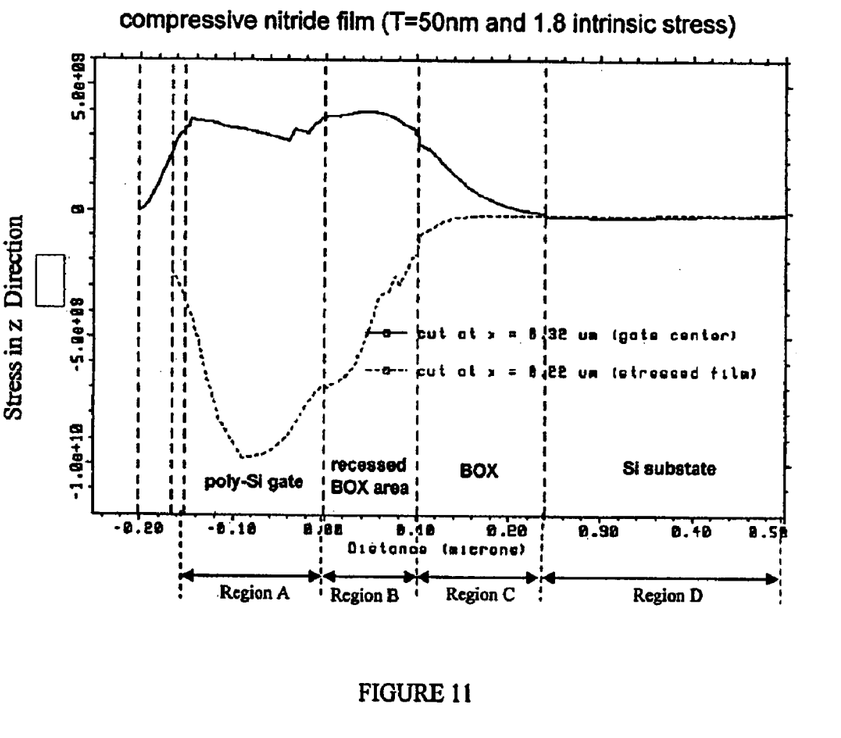
FIG. 11 is a graph of stress versus distance in a semiconductor device in accordance with the invention.

Referring to FIG. 11, a graph of stress in various regions of a device having a sub-gate stress film is shown. The Y-axis of the graph represents stress in the Z-direction which is perpendicular to an upper surface of the silicon substrate. The X axis represents distance in microns across the semiconductor device. In the graph, region A represents the region of the device which includes the polysilicon gate. Region B includes the region of the device extending least partially under the gate. Region C includes that portion of the semiconductor device adjacent to the channel region. And Region D includes the silicon substrate away from the channel region such as, for example, the cross-section represented by A-A' of FIG. 3. Additionally, the solid line of the graph represents measurements made on a cross-section through the center of the channel region. The dashed line represents measurements made on a cross-section through the stress film region of the semiconductor device, such as, for example, along the cross-section represented by B-B' of FIG. 4.

As can be seen by the dashed line representing stress through the stress film, the stress is about $1 \times 10^{10}$ Pa in Region A and drops to about $5 \times 10^9$ Pa in Region B. The stress then relatively flattens out to about 0 Pa in Region C and remain at 0 Pa in Region D. The solid line shows the stress in Region B being about $3 \times 10^9$ Pa in Region A as well as Region C. In Region C the stress drops from about $3 \times 10^9$ Pa to about 0 Pa and remains at about 0 Pa in Region D. The data are for a compressive nitride film where T=50 nm and the intrinsic stress is 1.8 GPa.

As discussed above, embodiments of the invention include forming a stress film partially or completely underneath the gate region of a semiconductor device where a STI oxide would normally be formed. By forming such a sub-gate stress film under a gate, in addition to stress film being formed in the substrate parallel to the gate structure, the amount of stress that can be applied to the channel of the semiconductor device by the stress film may be increased. It should also be noted the stress film replaces portions of the STI oxide and can abut directly against the silicon substrate.

While the invention has been described in terms of exemplary embodiments, those skilled in the art will recognize that the invention can be practiced with modifications and in the spirit and scope of the appended claims.

What is claimed is:

1. A method of manufacturing a CMOS device with a stressed channel, comprising the steps of:
    forming a silicon island comprising a top surface and multiple sidewalls;
    forming a gate structure comprising at least a gate oxide and a gate stack on the top surface, the gate structure extending beyond a sidewall of the silicon island; and
    surrounding a portion of the silicon island around the multiple sidewalls with a stress film.

2. The method of claim 1, further comprising surrounding substantially all of the silicon island around the multiple sidewalls with the stress film.

3. The method of claim 1, further comprising arranging the stress film to extend from a first side of the gate oxide to a second side of the gate oxide below the gate stack along a sidewall of the silicon island.

4. The method of claim 1, further comprising arranging the stress film to cover the gate structure of the CMOS device.

5. The method of claim 1, further comprising configuring the stress film to create a stress in the stressed channel with a direction approximately orthogonal to the top surface of the silicon island, along with a stress in the direction parallel to the top surface of the silicon island.

6. The method of claim 1, further comprising configuring the stress film to comprise $Si_3N_4$.

7. The method of claim 1, further comprising etching a tunnel under the gate stack adjacent a sidewall of the silicon island.

\* \* \* \* \*